United States Patent
Saito et al.

(10) Patent No.: US 6,620,737 B2
(45) Date of Patent: Sep. 16, 2003

(54) PLASMA ETCHING METHOD

(75) Inventors: Go Saito, Hikari (JP); Masamichi Sakaguchi, Kudamatsu (JP); Hitoshi Kobayashi, Tokuyama (JP); Motohiko Yoshigai, Hikari (JP); Satoshi Tani, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/946,509

(22) Filed: Sep. 6, 2001

(65) Prior Publication Data

US 2003/0022512 A1 Jan. 30, 2003

(30) Foreign Application Priority Data

Jul. 24, 2001 (JP) ........................................ 2001-223075

(51) Int. Cl.[7] ............................................ H01L 21/302
(52) U.S. Cl. ..................... 438/714; 216/67; 438/719; 438/725; 438/734; 438/717; 438/723; 438/724
(58) Field of Search .............................. 430/5; 134/1.2; 216/67; 438/725, 734, 717, 723, 719, 714, 724

(56) References Cited

U.S. PATENT DOCUMENTS 5,194,118 A * 3/1993 Shinohara ................... 156/643
5,935,874 A * 8/1999 Kennard ..................... 438/710
6,084,257 A * 7/2000 Petersen et al. .............. 216/17
6,127,278 A * 10/2000 Wang et al. .................. 216/67

FOREIGN PATENT DOCUMENTS

JP          11-135489        *   5/1999

OTHER PUBLICATIONS

"Rie Lag In Diffractive Optical Element Etching"; Microelectronic Engineering; (2000); 54(3–4); pp. 315–322; Ting et al.*

* cited by examiner

Primary Examiner—George Goudreau
(74) Attorney, Agent, or Firm—Antonelli, Terry, Stout & Kraus, LLP

(57) ABSTRACT

The temperature of the specimen holder 6 in the vacuum container 1 is lowered with the thermal control unit 11 to adjust the temperature of the specimen 7 composed of a silicon substrate to a low temperature of 0° C. or lower. Then, trenches are formed in the specimen 7 by plasma etching using an etching gas comprising $SF_6$ as the main constituent and optionally $O_2$ as an additive. Thus, the etching rate and the yield can be increased in the trench formation in the silicon semiconductor substrate.

9 Claims, 7 Drawing Sheets

FIG.3

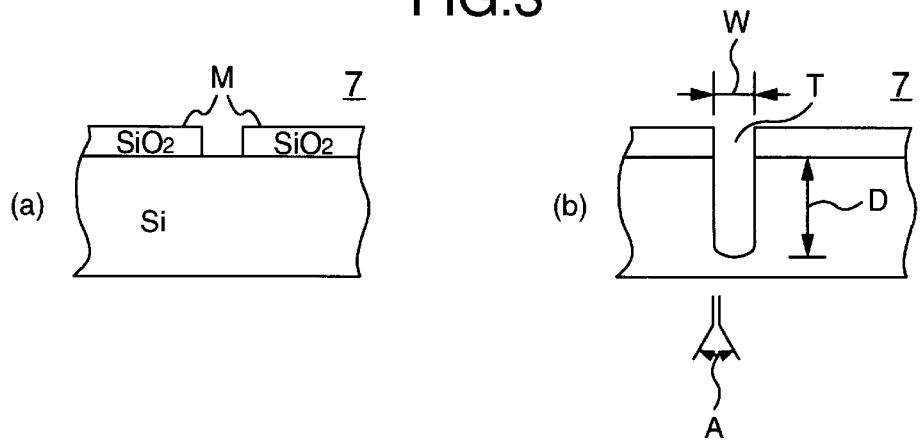

FIG.4

| CHARACTER-ISTIC / PARAMETER | Si ETCHING RATE  HIGH ↑ LOW | ANGLE OF INCLINATION A  POSITIVE ↑ NEGATIVE | SELECTION RATIO TO OXIDE FILM  HIGH ↑ LOW |
|---|---|---|---|
| TOTAL FLOW RATE 30 TO 80 (mL/min) LOW → HIGH | ↗ | ↘ | ↘ |
| FLOW RATE OF SF6 20 TO 50 (mL/min) LOW → HIGH | ↗ | ↘ | ↘ |
| FLOW RATE OF O2 10 TO 30 (mL/min) LOW → HIGH | ↘ | ↗ | ↗ |
| GAS PRESSURE 1.0 TO 4.0 (Pa) LOW → HIGH | ↗ | ↗ | ↗ |
| HIGH-FREQUENCY ELECTRIC POWER 0.10 TO 0.30 (w/cm²) LOW → HIGH | ↗ | ↗ | ↘ |
| SPECIMEN TEMPERATURE −50 TO 0 (°C) LOW → HIGH | NO SIGNIFICANT CHANGE | ↘ | NO SIGNIFICANT CHANGE |

FIG.8
(a) 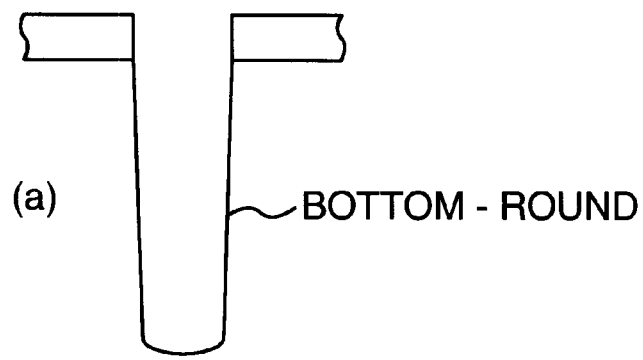 BOTTOM - ROUND
ETCHING RESIDUE
(b) 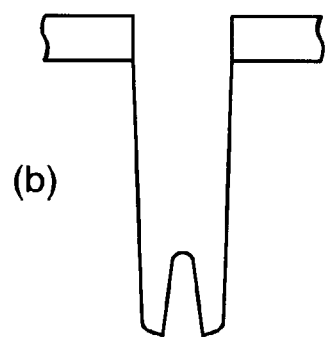
SUB-TRENCH
(c) 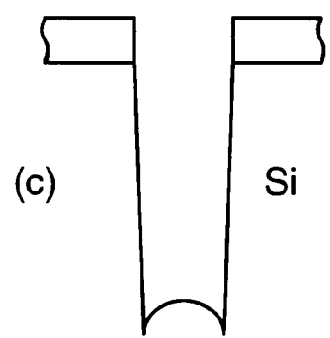 Si
ETCH STOP
(d) 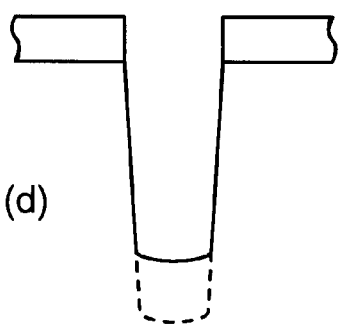
BOWING
(e) 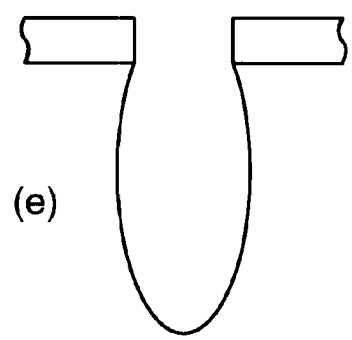
SIDE ETCH
(f) 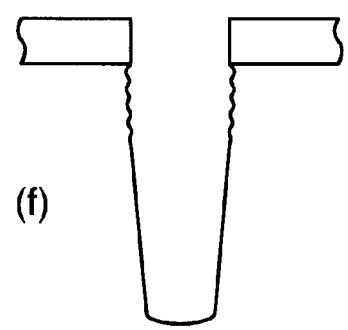

PLASMA ETCHING METHOD

BACKGROUND OF THE INVENTION

This invention relates to a method for forming trenches in a semiconductor substrate by plasma etching, in particular, a method for plasma etching of a silicon semiconductor substrate which is suitable for producing a semiconductor device.

Enhancement of the degree of integration of IC (semiconductor integrated circuit) is a constant problem, and micro-fabrication is always pursued. For example, in the formation of trenches (grooves or holes) required in an IC for memory such as DRAM, the aspect ratio (the ratio of length to width of the groove or hole) and the shape of section are especially important.

In this case, the aspect ratio is preferably 10 or more, and the shape of section is as follows from an idealistic viewpoint: as shown in FIG. 8(a), the trench has a sidewall portion composed of a smooth plane, the angle of inclination of the sidewall portion is about 0° (perpendicular), and the bottom of the trench has a semicircular-concavity shape (a bottom-round shape). Here, the reason why the bottom-round shape is preferable is that the bottom-round shape facilitates operations in a subsequent step of embedding an insulating film.

However, the shape of section often becomes undesirable. As undesirable examples of the shape of section, there are known shapes of section called "etching residue" (shown in FIG. 8(b)), "sub-trench" (shown in FIG. 8(c)), "etch stop" (shown in FIG. 8(d)), "bowing" (shown in FIG. 8(e)), "side etch" (shown in FIG. 8(f)) and the like.

As such a technique for forming trenches in a Si (silicon) semiconductor substrate, there is a technique comprising plasma etching. Such a technique has been disclosed, for example, in JP-A-11-135489.

This reference discloses a method in which trenches are formed in a silicon substrate by using as an etching gas a mixed gas comprising HBr (hydrogen bromide) gas as the main constituent and additional gases such as $SF_6$ (sulfur hexafluoride) gas, $SiF_4$ (silicon tetrafluoride) gas, He (helium), $O_2$ (oxygen), etc.

SUMMARY OF THE INVENTION

In the above prior art, no attention is paid to the employment of HBr gas as the main constituent, so that the etching rate and the yield are not sufficiently increased.

That is, in the above prior art, SiBr (silicon bromide) is produced as a reaction product because the main constituent of the etching gas is HBr. Since SiBr has a low vapor pressure, the etching rate is restricted. Thus, the etching rate cannot be increased.

Moreover, in the above prior art, reaction products such as $SiO_xBr_y$ (wherein each of x and y is an integer) are produced in an etching chamber because the main constituent of the etching gas is HBr. Consequently, the reaction products adhering to, for example, the wall surface of the etching chamber are peeled to become fine particles, with an increase of the number of etching operations. Since contamination with the particles hinders the etching, the yield cannot be increased.

An object of the present invention is to provide a method for plasma etching of a semiconductor substrate which makes it possible to increase the etching rate and the yield in the formation of trenches.

The above object can be achieved by adopting a plasma etching method comprising forming trenches in a silicon semiconductor substrate by using a mask made of silicon oxide or silicon nitride or a composite film thereof, wherein the temperature of the silicon semiconductor substrate is maintained at 0° C. or lower and the trenches are formed by using a plasma etching gas comprising sulfur hexafluoride as the main constituent.

In this case, the above object can be also achieved when the aforesaid etching gas comprising sulfur hexafluoride as the main constituent contains oxygen. The above object can be also achieved by using as an etching gas a gas prepared by adding hydrogen bromide to the above-mentioned mixed gas prepared by adding oxygen to sulfur hexafluoride.

In addition, the above object can be also achieved by adopting a plasma etching method comprising forming trenches in a silicon semiconductor substrate by using a mask made of silicon oxide or silicon nitride or a composite film thereof, wherein the temperature of the silicon semiconductor substrate is maintained at 0° C. or lower, and the trenches are formed by using a plasma etching gas comprising carbon tetrafluoride as the main constituent and then a plasma etching gas comprising sulfur hexafluoride as the main constituent.

Furthermore, the above object can be also achieved by adopting a plasma etching method comprising forming trenches in an SOI semiconductor substrate by using a mask made of silicon oxide or silicon nitride or a composite film thereof, wherein the temperature of the SOI semiconductor substrate is maintained at 0° C. or lower, the trench formation is carried out to a depth corresponding to 70% to 90% of the thickness of the silicon semiconductor layer of said SOI semiconductor substrate by using a plasma etching gas comprising sulfur hexafluoride as the main constituent, and then the trench formation is further carried out to such a depth that the residual layer thickness, i.e., 30% to 10% of the thickness of the silicon semiconductor layer becomes zero, by using a plasma etching gas containing no fluorine.

BRIEF DESCRIPTION OF THE DRAWINGS

FIG. 3 is a cross-sectional view showing an example of specimen used in the embodiment of the present invention.

FIG. 4 is a diagram for explaining etching parameters used in the embodiment of the present invention.

FIG. 8 is a cross-sectional view for explaining various shapes of trench for semiconductor substrates.

DETAILED DESCRIPTION OF THE INVENTION

The plasma etching method of the present invention is explained below in detail with reference to the drawings.

Figure 2:
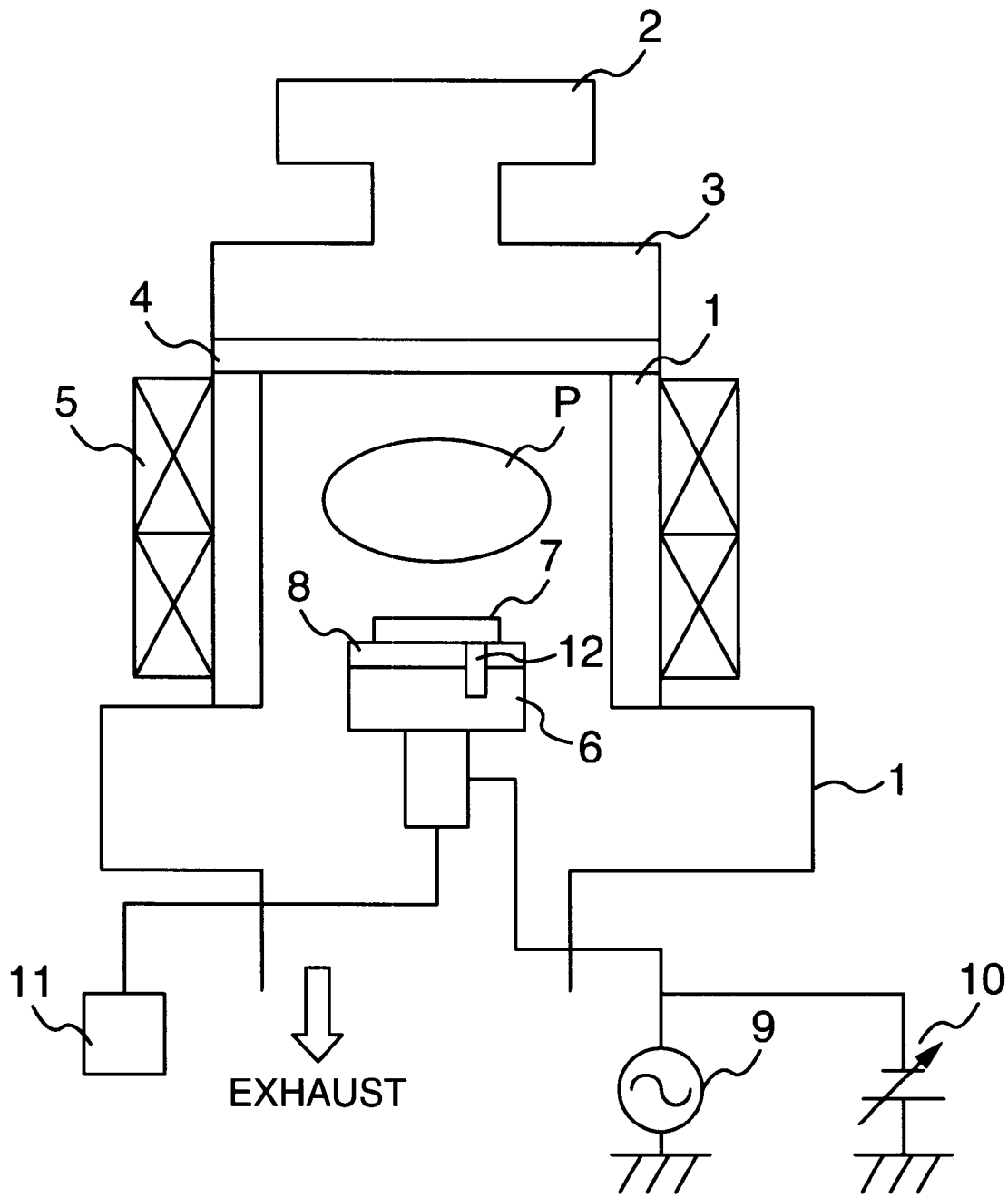
FIG. 2 is a diagram showing the structure of an example of etching apparatus used for practicing the plasma etching method of the present invention.

First, an example of plasma etching apparatus used in conducting the present invention is explained below. As shown in FIG. 2, the apparatus comprises a vacuum container 1 as an etching chamber and a microwave power source 2. From the microwave power source 2, microwaves are introduced into the vacuum container 1 through a waveguide 3 and a quartz plate 4.

An electromagnet 5 is provided around the vacuum container 1, so that a gas in the vacuum container 1 may be subjected to electron cyclotron resonance by a magnetic field and microwaves to produce a plasma P in the vacuum container 1.

A specimen holder 6 is provided in the vacuum container 1, and a specimen 7 such as a Si substrate (wafer) introduced into the vacuum container 1 is set on the specimen holder 6. In this case, a dielectric film 8 is held between the specimen 7 and the specimen holder 6 to provide electrical insulation.

The specimen holder 6 is held at a predetermined position in the vacuum container 1 so as to be insulated from common-potential portions including the conductor portions of the vacuum container 1, such as an earthing portion. In such a situation, a high-frequency power source 9 and a variable-voltage direct-current power source 10 are connected to the specimen holder 6 so that the specimen holder 6 may be maintained at any of predetermined voltages. The specimen 7 can be positioned on the specimen holder 6 by adsorbing the specimen 7 by a Coulomb's force (an electrostatic force) produced mainly by a direct-current voltage among the predetermined voltages.

The specimen holder 6 is equipped with a thermal control unit 11 that adjusts the temperature of the specimen holder 6 to a predetermined temperature. In this case, the specimen holder 6 is equipped with a temperature sensor 12, and the thermal control unit 11 detects the actual temperature of the specimen 7 with the temperature sensor 12 and adjusts the actual temperature to a predetermined temperature.

The thermal control unit 11 is equipped with a cooling device comprising a heat pump or the like, supplies a refrigerant of a temperature considerably lower than ordinary temperature to the specimen holder 6, and can maintain the temperature of the refrigerant at a low temperature of, for example, about −20° C. The above-mentioned temperature adjustment can be achieved by controlling the temperature and flow rate of the refrigerant, depending on the temperature detected with the temperature sensor 12.

Figure 1:
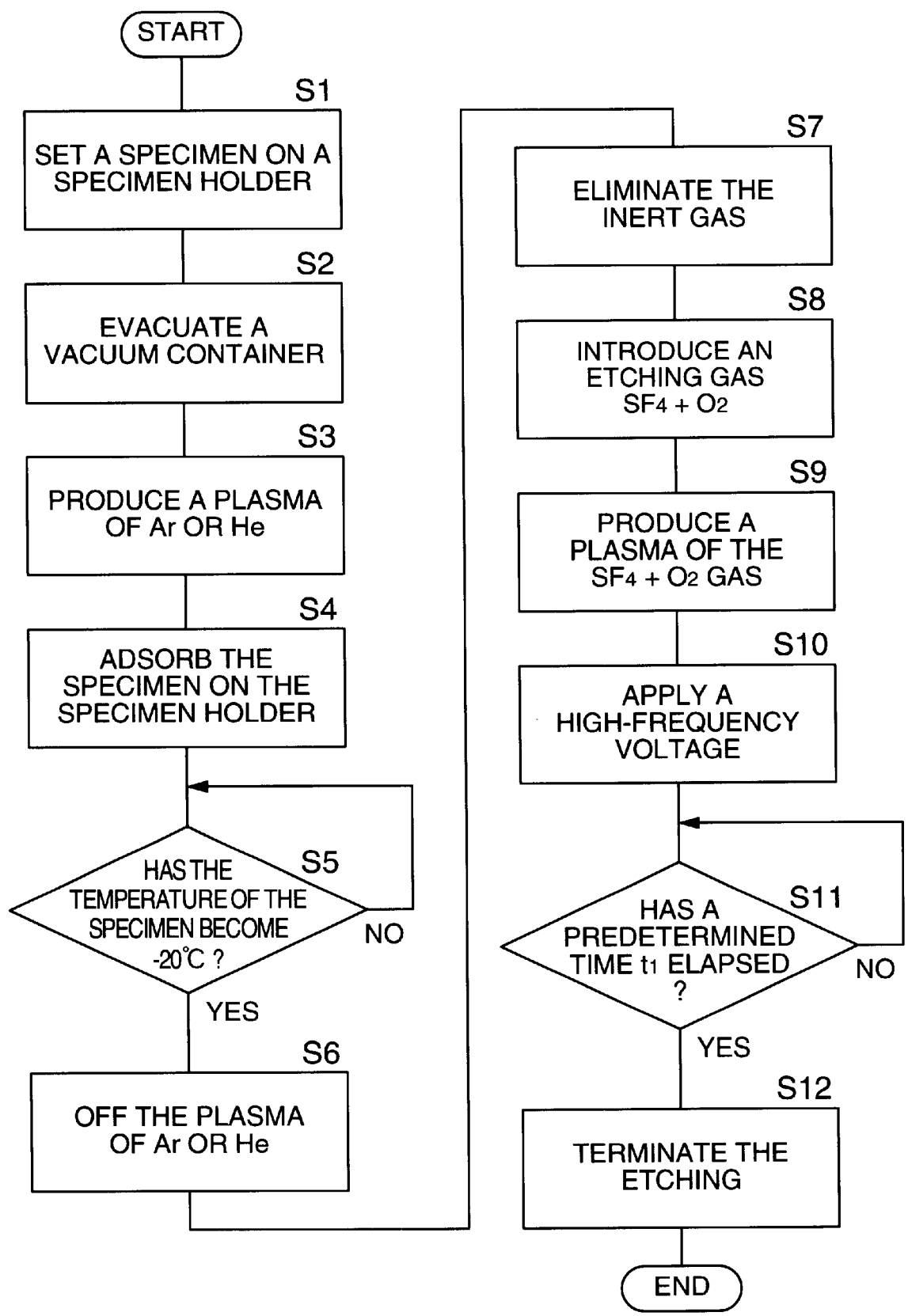
FIG. 1 is a flow chart for explaining etching carried out according to one embodiment of the plasma etching method of the present invention.

Next, a procedure for plasma etching of a Si substrate according to one embodiment of the present invention in the case of using the plasma etching apparatus shown in FIG. 2 is explained with reference to the flow chart shown in FIG. 1. In FIG. 1, S1 to S12 represent operation steps, respectively.

First, a voltage is applied to the specimen holder 6 from the direct-current power source 10 while adjusting the temperature of the specimen holder 6 to −20° C. or lower by means of the thermal control unit 11.

On the other hand, a Si substrate carrying a mask M for trench formation as shown in FIG. 3(a) is prepared as the specimen 7.

As the mask M, a mask made of silicon oxide or silicon nitride or a composite film thereof is used. For example, there is used a mask obtained by, as shown in FIG. 3(a), forming an oxide film ($SiO_2$) on the trench formation surface (the top surface in FIG. 3(a)) of a Si substrate and then perforating the oxide film in conformity with the planar shape of necessary trenches to form a desirable pattern.

The specimen 7 having the mask M formed thereon is introduced into the vacuum container 1 and set on the specimen holder 6 (S1).

Then, the vacuum container 1 is evacuated by means of a vacuum pump not shown (S2). While maintaining the internal pressure at a predetermined pressure, for example, 1 Pa by introducing Ar (argon) or He as an inert gas into the vacuum container 1, a plasma P of the inert gas is produced by operating the microwave power source 2 and the electromagnet 5 (S3).

The specimen 7 is thus electrified and adsorbed on the specimen holder 6 by Coulomb's force produced owing to the direct-current voltage applied to the specimen holder 6 (S4).

Next, the temperature of the specimen 7 is detected with the temperature sensor 12 and waited for to become a predetermined temperature (S5).

After it is confirmed that the temperature of the specimen 7 has become the predetermined temperature, the irradiation with microwaves and the application of a magnetic field are stopped to vanish (off) the plasma P (S6). The time required for the above steps is about 30 seconds.

Thereafter, the inert gas is eliminated from the vacuum container 1 with the vacuum pump (S7), and an etching gas comprising $SF_6$ as the main constituent is introduced into the vacuum container 1 in place of the inert gas (S8). Then, a plasma P is produced again by irradiation with microwaves and application of a magnetic field (S9), and a high-frequency voltage is applied to the specimen holder 6 from the high-frequency power source 9 (S10).

Thus, ions in the plasma P of the etching gas as an ion source are accelerated by a high-frequency electric field to be introduced into the specimen 7 at a high speed. As a result, plasma etching of the specimen 7 is initiated and trenches are formed with the progress of the etching.

After the lapse of a predetermined time $t_1$ (S11), the application of the high-frequency voltage, the irradiation with the microwaves and the application of the magnetic field are stopped to terminate the etching (S12).

The predetermined time $t_1$ is a time required for the etching to proceed to a desirable depth D under the etching conditions employed. The predetermined time $t_1$ may be a time previously determined by calculation, trial etching or the like.

Therefore, by eliminating the etching gas from the vacuum container 1 after the termination of the etching, and taking out the specimen 7, there can be obtained the specimen 7 having trenches T formed thereon which have a substantially ideal shape composed of a smooth sidewall surface and a semicircular base and have a desirable depth D.

Parameters (etching parameters) that determine the etching conditions are as follows:

Etching gas: $SF_6$ (sulfur hexafluoride)+$O_2$ (oxygen)

Gas flow rate: $SF_6$→30 mL/min $O_2$→20 mL/min

∴ gas ratio→3:2

Gas pressure: 3 Pa

Microwave electric power: 800 W

High-frequency electric power: 0.15 W/cm$^2$

Specimen temperature: −20° C.

Etching time ($t_1$): 3.3 min.

In this case, etching characteristics are as follows:

Etching rate: 3 μm/min (a minimum)

Selection ratio: 30 (a minimum).

Here, the term "selection ratio" means a selection ratio to the oxide film. In detail, this term means the ratio of the etching rate of Si as a material for the substrate to that of SiO$_2$ as a material for the mask.

As a result, according to the above embodiment, the following trenches T could be formed:

Shape of trench: a smooth sidewall surface and bottom-round

Width of trench W: 0.5 μm

Depth of trench D: 10.0 μm

∴ aspect ratio 20

Angle of inclination A: 0°~1°.

The definitions of the width W, depth D and angle of inclination A of the trench T are as shown in FIG. 3(b).

In the embodiment, since the main constituent of the etching gas is SF$_6$ gas, there is no fear that a component having a low vapor pressure, such as SiBr may be produced during the etching. Therefore, a high etching rate can be attained easily and certainly. Furthermore, in the embodiment, since the temperature of the specimen 7 is adjusted to a low temperature of 0° C. or lower, the occurrence of the bowing or side etch described above is suppressed, so that anisotropic etching becomes possible. Accordingly, a high selection ratio can easily be attained.

Therefore, it can be seen that according to the embodiment, a high etching rate of at least 3 μm/min and a high selection ratio of at least 30 can be attained as described above.

Thus, according to the embodiment, a high etching rate for Si and a high selection ratio can be attained, so that trenches having a superior shape can be formed rapidly and easily.

In addition, according to the embodiment, reaction products such as SiO$_x$Br$_y$ are not produced because the main constituent of the etching gas is SF$_6$ gas. Therefore, there is no fear of contamination of the specimen 7 with fine particles, so that the yield can be greatly increased.

That is, in the embodiment, the etching gas comprises SF$_6$ gas as its main constituent and O$_2$ as an additive, and moreover the temperature of the specimen (the Si substrate) is adjusted to a low temperature of 0° C. or lower. Consequently, the etching can be achieved at a high etching rate for Si and a high selection ratio.

In the embodiment, since the main constituent of the etching gas is not HBr, there is no fear that a component having a low vapor pressure, such as SiBr may be produced during the etching. Moreover, in the embodiment, since reaction products such as SiO$_x$Br$_y$ are not produced because the main constituent of the etching gas is not HBr, there is no fear of contamination of the specimen 7 with fine particle, so that the yield can easily be increased.

In the embodiment, SF$_6$ gas is the main constituent of the etching gas and Si is etched by the following reaction:

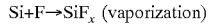

Si+F→SiF$_x$ (vaporization)

On the other hand, the additive O$_2$ controls the etching rate of SiO$_2$ (the silicon oxide film) used as a material for the mask, and oxidizes Si and SiF produced as reaction products, to form a protective film on the surface of the mask. Furthermore, the additive O$_2$ oxidizes Si on the inner-wall surface of each trench formed by the etching, to form a protective film of SiO$_x$, too.

FIG. 4 is an example of characteristic diagram showing the ranges of the parameters in the embodiment and the changes of characteristics (effects) with a change of each parameter. In the embodiment, the main constituent of the etching gas should be SF$_6$ gas and the temperature of the specimen should be 0° C. or lower. In this case, according to the characteristic diagram shown in FIG. 4, it can be seen that each characteristic (effect) has the peculiar tendency shown in FIG. 4 when each parameter is varied. In FIG. 4, as to the angle of inclination A, the tendency of the trench width W to decrease with a decrease of the distance from the bottom of the trench is taken as positive (+) and the tendency of the trench width W to increase with a decrease of the distance from the bottom of the trench is taken as negative (–).

Therefore, according to the embodiment of the present invention, parameters required for obtaining a desirable shape of trench can easily be chosen, and a specimen having the desirable shape of trench can be certainly obtained under necessary plasma etching conditions at a high etching rate without a fear of contamination with fine particles.

As is clear from FIG. 4, according to the embodiment of the present invention, it is possible to change only the angle of inclination A without any significant influence on the etching rate and the selection ratio to the oxide film, by changing the temperature of the specimen 7 in a range of 0° C. to –50° C.

Therefore, according to the embodiment, the etching rate and the yield can be sufficiently increased by using an etching gas comprising SF$_6$ gas as the main constituent, while maintaining an ideal shape of trench obtained by choosing a proper angle of inclination A.

The etching gas usable in the embodiment of the present invention is not limited to the above-mentioned gas SF$_6$+O$_2$. The embodiment may be carried out by using either an SF$_6$+O$_2$+Cl$_2$ gas prepared by adding Cl$_2$ (chlorine) or an SF$_6$+O$_2$+HBr gas prepared by adding HBr, so long as the main constituent of the etching gas is SF$_6$ gas.

Next, the application of the present invention to the formation of trenches in an SOI (silicon on insulator) substrate is explained below as another embodiment of the present invention.

Figure 5:
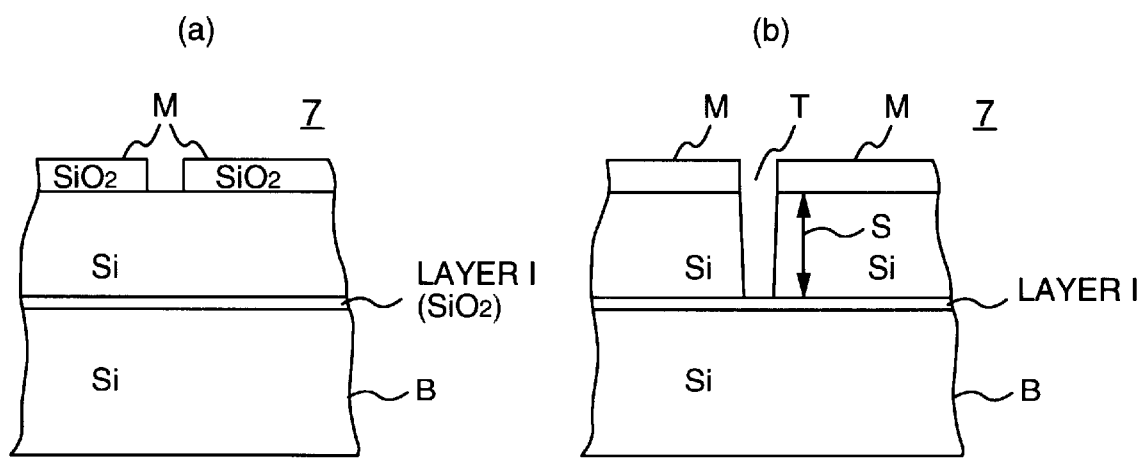
FIG. 5 is a cross-sectional view showing an example of specimen used in another embodiment of the present invention.

The SOI substrate is that obtained by, as shown in FIG. 5(a), forming an insulating film I of SiO$_2$ on one side of a Si substrate B and growing a Si layer as a semiconductor layer on the insulating film I. In this case, the SOI substrate carries a mask M for forming trenches, like the specimen 7 explained in FIG. 3(a).

Also in the case of the SOI substrate, an ideal shape of trench is such that as shown in FIG. 8(a), the trench has a sidewall portion composed of a smooth plane and having an angle of inclination of about 0°. However, in the case of the SOI substrate, the bottom of the trench T should reach the insulating film I as shown in FIG. 5(b).

The embodiment using the SOI substrate is explained below with reference to the flow chart shown in FIG. 6.

Figure 6:
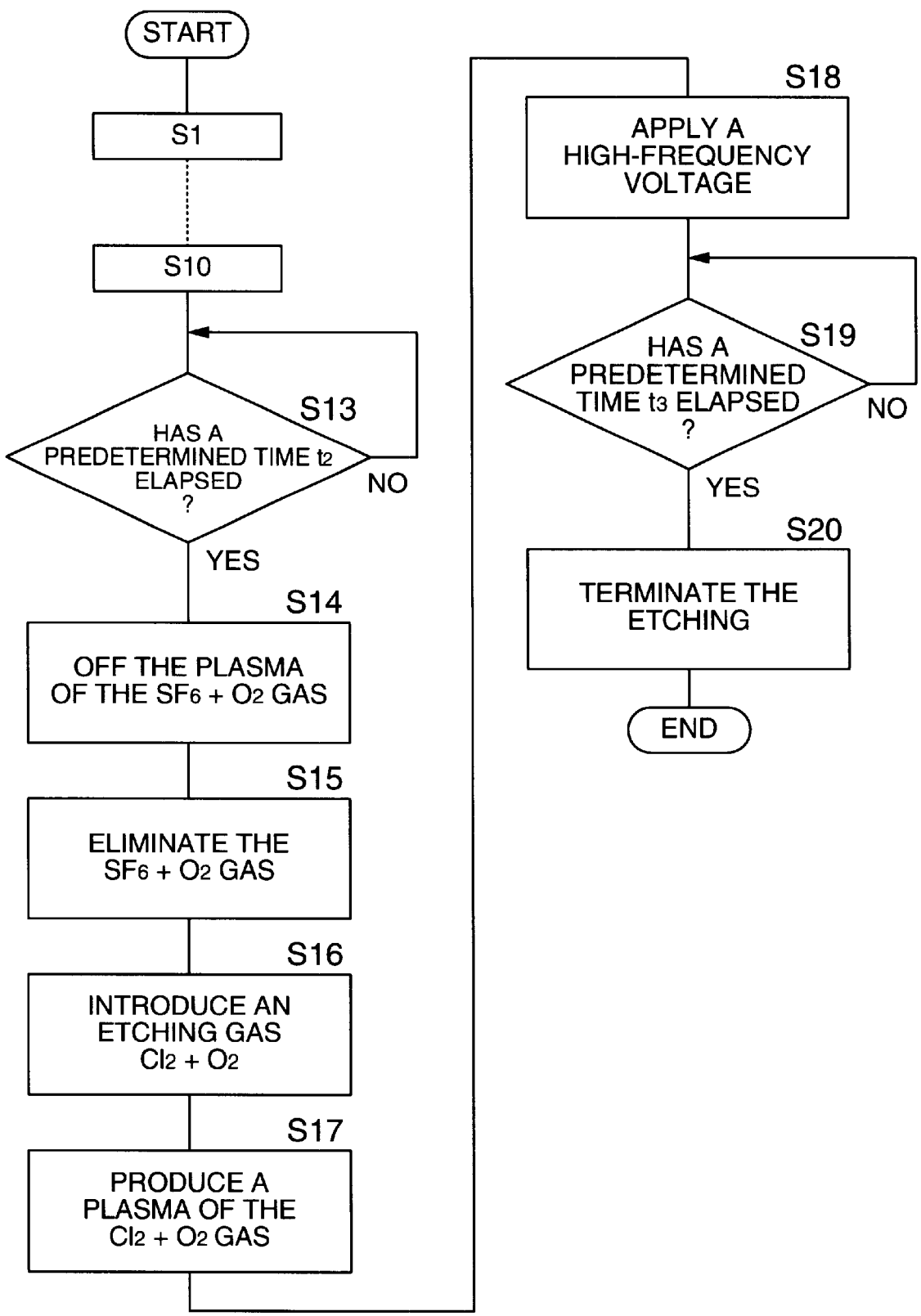
FIG. 6 is a flow chart for explaining etching carried out according to the other embodiment of the plasma etching method of the present invention.

In the flow chart shown in FIG. 6, the description of the operations S1 to S10 are simplified because the operations S1 to S10 are the same as in the flow chart shown in FIG. 1 except for using the SOI substrate shown in FIG. 5(a), as the specimen 7.

The specimen 7 composed of the SOI substrate is set on the specimen holder 6 in the vacuum container 1, and the operations S1 to S10 are carried out. A waiting period after these operations is a predetermined time t$_2$ different from the above-mentioned predetermined time t$_1$ (S13). The predetermined time t$_2$ is a time required for the etching to proceed to a depth corresponding to 70% to 90% of the thickness S of the Si semiconductor layer shown in FIG. 5(b), under the etching conditions employed in this case. Like the above-mentioned time t$_1$, the predetermined time t$_2$ may be a time previously determined by calculation, trial etching or the like.

After the lapse of the predetermined time $t_2$, the supply of microwaves and the application of a magnetic field are stopped to off a plasma P produced by using an etching gas of $SF_6+O_2$ (S14), and then the etching gas of $SF_6+O_2$ is removed (S15). Subsequently, $Cl_2$ (chlorine) and $O_2$ are supplied to the vacuum container 1 (S16). Using a mixed gas thereof containing no fluorine, as and etching gas, plasma etching is initiated (S17, S18).

As a result, the etching for forming trenches T which has proceeded to a depth corresponding to 70% to 90% of the thickness S of the Si semiconductor layer before completion of the operation S13 is resumed to proceed in a portion corresponding to the residual layer thickness, i.e., 10% to 30% of the thickness S.

After the lapse of a predetermined time $t_3$ in the above situation, the etching is terminated (S19, S20).

The predetermined time $t_3$ is a time required for the etching to proceed in a portion corresponding to the residual layer thickness, i.e., 10% to 30% of the thickness S of the Si semiconductor layer, under the etching conditions employed in this case. Like the above-mentioned time $t_1$, the predetermined time $t_3$ may be a time previously determined by calculation, trial etching or the like.

Therefore, when the operation S19 comes to a close, the bottom of the trench T has reached the insulating film I. Consequently, the SOI substrate having, as trenches formed therein, the trenches T extending from the surface of the Si semiconductor layer to the insulating film I, i.e., the trenches T each having a bottom reaching the insulating film I as shown in FIG. 5(b) can be obtained as the specimen 7 by terminating the etching in S20.

The present embodiment has inestimable advantages because IC using an SOI substrate has been often used in recent years.

The above-mentioned time $t_3$ may be rather long without any particular trouble when it is considered that a selection ratio to the oxide film of 30 or more can be attained. The time $t_3$, however, is preferably minimized because a long time $t_3$ is disadvantageous in throughput.

The etching gas supplied to the vacuum container 1 in the operation S16 is not limited to the above-mentioned $Cl_2+O_2$ gas, and any gas may be used as the etching gas so long as it does not contain fluorine. For example, a mixed gas of $HBr+O_2$ or a mixed gas of $Cl_2+HBr+O_2$ may be used.

Still another embodiment of the present invention is explained below with reference to the flow chart shown in FIG. 7.

Figure 7:
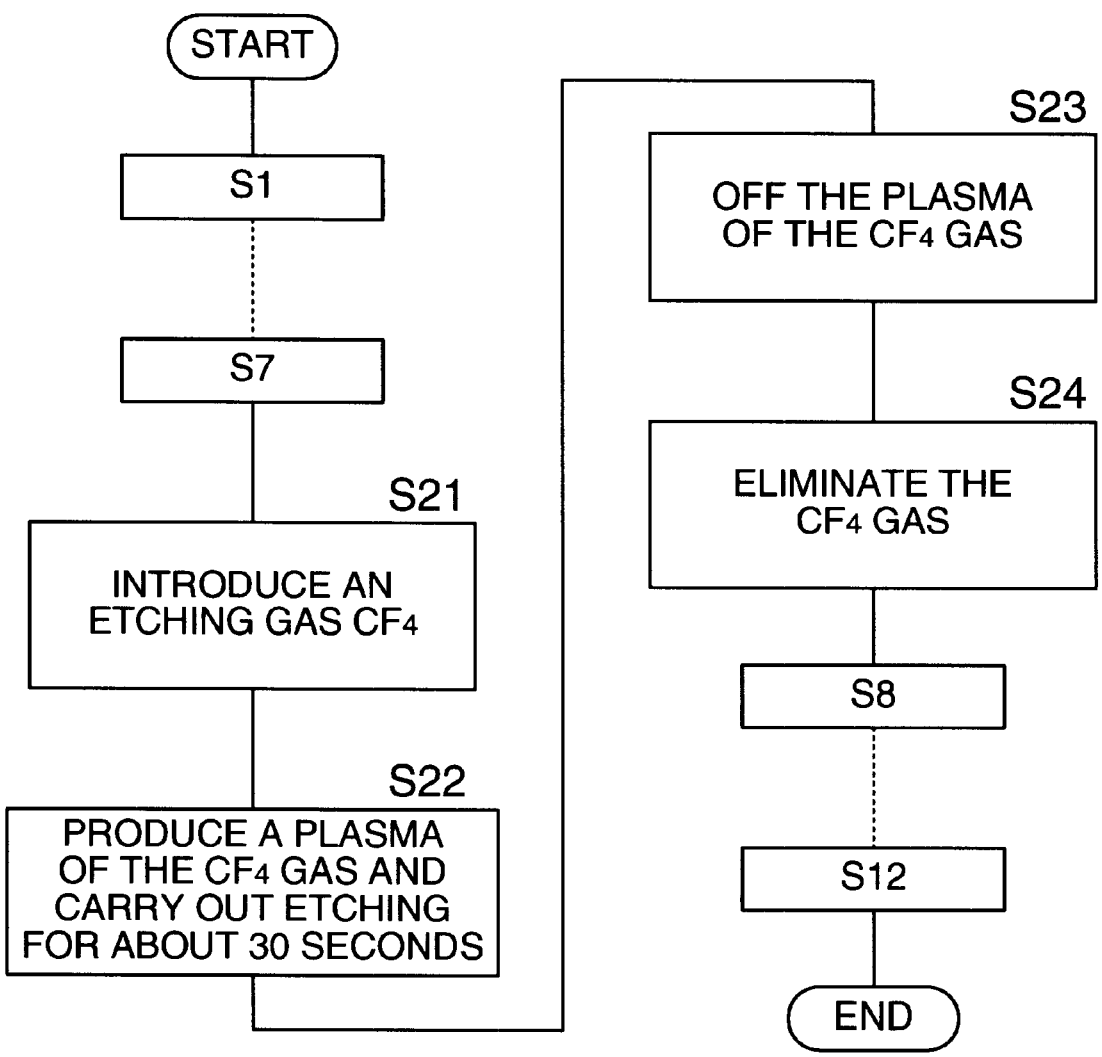
FIG. 7 is a flow chart for explaining etching carried out according to still another embodiment of the plasma etching method of the present invention.

In the embodiment shown in FIG. 7, operations S21 to S24 are added between the operations S7 and S8 in the embodiment shown in FIG. 1, whereby plasma etching using an etching gas comprising $CF_4$ (carbon tetrafluoride) as the main constituent is added before the plasma etching using the etching gas comprising $SF_6$ as the main constituent.

In detail, after completion of the operation 7, the etching gas comprising $CF_4$ gas as the main constituent is introduced (S21). A plasma is produced and etching is carried out for a predetermined time, for example, 30 seconds (S22). Then, the plasma is offed (S23) and the $CF_4$ gas is removed (S24). Thereafter, the operations S8 to S12 are carried out.

According to the present invention, parameters required for obtaining a desirable shape of trench can easily be chosen, and a specimen having the desirable shape of trench can be certainly obtained under necessary plasma etching conditions at a high etching rate without a fear of contamination with fine particles. Consequently, the throughput and the yield can be markedly increased. Thus, the present invention can contribute greatly to the reduction of the cost of memory IC, etc.

Although the present invention is explained above with the embodiments, it is applicable irrespective of a method for producing a plasma. Therefore, the same effects as above can be obtained also by conducting the present invention by using a parallel-plate RIR apparatus, a helicon etching apparatus, an inductive-coupling etching apparatus or the like.

What is claimed is:

1. A plasma etching method comprising forming trenches in a silicon semiconductor substrate by using a mask made of silicon oxide or silicon nitride or a composite film thereof, wherein the temperature of the silicon semiconductor substrate is maintained in a range of 0° C. to −50° C. and the trenches are formed by using a plasma etching gas comprising sulfur hexafluoride as the main constituent, oxygen and hydrogen bromide.

2. The plasma etching method according to claim 1, wherein the substrate is previously cooled before the beginning of etching.

3. A plasma etching method comprising forming trenches in a silicon semiconductor substrate by using a mask made of silicon oxide or silicon nitride or a composite film thereof, wherein the temperature of the silicon semiconductor substrate is maintained at 0° C. or lower and the trenches are formed by using a plasma etching gas comprising carbon tetrafluoride as the main constituent and then a plasma etching gas comprising sulfur hexafluoride as the main constituent.

4. A plasma etching method comprising forming trenches in an SOI semiconductor substrate by using a mask made of silicon oxide or silicon nitride or a composite film thereof, wherein the temperature of the SOI semiconductor substrate is maintained at 0° C. or lower, the trench formation is carried out to a depth corresponding to 70% to 90% of the thickness of the silicon semiconductor layer of said SOI semiconductor substrate by using a plasma etching gas comprising sulfur hexafluoride as the main constituent, and then the trench formation is further carried out to such a depth that the residual layer thickness, i.e., 30% to 10% of the thickness of the silicon semiconductor layer becomes zero, by using a plasma etching gas containing no fluorine.

5. A plasma etching method comprising forming trenches in a silicon semiconductor substrate by using a mask made of silicon oxide or silicon nitride or a composite film thereof, wherein the temperature of the silicon semiconductor substrate is maintained in a range of 0° C. to −50° C. and the trenches are formed by using a plasma etching gas which consists essentially of sulfur hexafluoride as the main constituent and oxygen and chlorine as additives.

6. A plasma etching method comprising forming trenches in a silicon semiconductor substrate by using a mask made of silicon oxide or silicon nitride or a composite film thereof, wherein the temperature of the silicon semiconductor substrate is maintained in a range of 0° C. to −50° C. and the trenches are formed by using a plasma etching gas which consists essentially of sulfur hexafluoride as the main constituent and oxygen and hydrogen bromide as additives.

7. The plasma etching method according to claim 1, wherein said plasma etching gas does not contain an inert gas.

8. The plasma etching method according to claim 1, wherein said plasma etching gas does not contain helium.

9. The plasma etching method according to claim 1, wherein said plasma etching gas does not contain argon.

* * * * *